(12) United States Patent
Martin et al.

(10) Patent No.: US 7,349,070 B2
(45) Date of Patent: Mar. 25, 2008

(54) MULTIPLE LEVEL PHOTOLITHOGRAPHY

(75) Inventors: Brian Martin, Plymouth (GB); John Perring, Plymouth (GB); John Shannon, Plymouth (GB)

(73) Assignee: X-Fab Semiconductor Foundries AG, Erfurt (DE)

( * ) Notice: Subject to any disclaimer, the term of this patent is extended or adjusted under 35 U.S.C. 154(b) by 51 days.

(21) Appl. No.: 11/200,421

(22) Filed: Aug. 9, 2005

(65) Prior Publication Data
US 2006/0050255 A1 Mar. 9, 2006

Related U.S. Application Data

(63) Continuation-in-part of application No. 10/231,918, filed on Aug. 30, 2002, now Pat. No. 6,949,330.

(30) Foreign Application Priority Data
Sep. 1, 2001 (GB) .................... 0121217.4

(51) Int. Cl.
*G03B 27/42* (2006.01)
*G03B 27/44* (2006.01)
*G03B 27/58* (2006.01)

(52) U.S. Cl. .................. 355/53; 355/46; 355/74

(58) Field of Classification Search .......... 355/53, 355/46, 75, 74; 430/5, 20, 22
See application file for complete search history.

(56) References Cited

U.S. PATENT DOCUMENTS

| | | | |
|---|---|---|---|
| 4,210,465 A | 7/1980 | Brower | |
| 4,690,728 A | 9/1987 | Tsang et al. | |
| 4,829,024 A | 5/1989 | Klein et al. | |
| 5,134,058 A | 7/1992 | Han | |
| 5,310,457 A | 5/1994 | Ziger | |
| 5,612,956 A | 3/1997 | Walker et al. | |

(Continued)

FOREIGN PATENT DOCUMENTS

EP 0 601 887 6/1994

(Continued)

OTHER PUBLICATIONS

D. A. McGillis, Lithography, VLSI Technology, McGraw-Hill Book Company, New York (1983), pp. 267-268, 303-304.

*Primary Examiner*—Alan Mathews
(74) *Attorney, Agent, or Firm*—Patterson & Sheridan, LLP

(57) ABSTRACT

A method is provided for performing photolithography on a substrate which has a first region on a lower level and a second region on an upper level, wherein a first pattern area exists within said first region, a second pattern area exists within said second region, and at least said first and second regions are coated with a photoresist, the method comprising: a) exposing the photoresist through a first mask so as to expose said first region including said first pattern area, and thus create a first pattern in said first pattern area, but not expose said second pattern area; and b) exposing the photoresist through a second mask so as to expose said second pattern area, and thus create a second pattern in said second pattern area, but not expose said first pattern area, and also to expose an area of said first region which lies adjacent said second region.

10 Claims, 2 Drawing Sheets

U.S. PATENT DOCUMENTS

| | | | |
|---|---|---|---|
| 5,702,868 A | 12/1997 | Kellam et al. | |
| 5,790,552 A | 8/1998 | Proctor et al. | |
| 6,171,405 B1 | 1/2001 | Lee | |
| 6,190,807 B1* | 2/2001 | Wang et al. | 430/5 |
| 6,238,850 B1* | 5/2001 | Bula et al. | 430/394 |
| 6,251,564 B1 | 6/2001 | Lin et al. | |
| 6,368,754 B1* | 4/2002 | Imai | 430/5 |
| 6,399,283 B1* | 6/2002 | Hoshi | 430/312 |
| 6,590,636 B2* | 7/2003 | Nishi | 355/53 |
| 2001/0005565 A1* | 6/2001 | Fujimoto | 430/5 |
| 2002/0142232 A1* | 10/2002 | Kling et al. | 430/5 |
| 2002/0150841 A1* | 10/2002 | Wang et al. | 430/322 |
| 2003/0022112 A1 | 1/2003 | Arifin et al. | |
| 2003/0044734 A1* | 3/2003 | Martin et al. | 430/394 |
| 2003/0087193 A1* | 5/2003 | Okada et al. | 430/311 |
| 2003/0129502 A1* | 7/2003 | Chen et al. | 430/5 |
| 2003/0142284 A1* | 7/2003 | Lin | 355/77 |
| 2004/0076889 A1* | 4/2004 | Huang et al. | 430/5 |
| 2005/0105068 A1* | 5/2005 | Komine | 355/46 |
| 2006/0088772 A1* | 4/2006 | Zhang | 430/5 |

FOREIGN PATENT DOCUMENTS

| | | |
|---|---|---|
| EP | 0 618 709 | 10/1994 |
| EP | 0 705 000 | 4/1996 |
| EP | 1 122 916 | 8/2001 |
| EP | 0 468 818 | 1/2002 |
| GB | 2 270 820 | 3/1994 |
| JP | 2 280439 | 11/1990 |
| JP | 09-055746 | 2/1997 |
| WO | WO 90/07832 | 7/1990 |

* cited by examiner

MULTIPLE LEVEL PHOTOLITHOGRAPHY

CROSS-REFERENCE TO RELATED APPLICATIONS

This application is a continuation-in-part of U.S. patent application Ser. No. 10/231,918, filed Aug. 30, 2002 now U.S. Pat. No. 6,949,330, claims priority of United Kingdom Application No. 0121217.4, filed on Sep. 1, 2001. Each of the aforementioned related patent applications is herein incorporated by reference.

BACKGROUND OF THE INVENTION

1. Field of the Invention

The invention relates to photolithography on a substrate having more than one level.

2. Description of the Related Art

By way of background explanation, in photolithography techniques features are printed by passing light through a "reticle", which acts as a mask and is typically formed from glass printed with chrome patterns. In order to print lines the reticle is provided with slits which allow the light to pass through onto the photoresist (a photosensitive layer used to coat silicon in photolithography techniques).

SUMMARY OF THE INVENTION

A method is provided for performing photolithography on a substrate which has a first region on a lower level and a second region on an upper level, wherein a first pattern area exists within said first region, a second pattern area exists within said second region, and at least said first and second regions are coated with a photoresist, the method comprising: a) exposing the photoresist through a first mask so as to expose said first region including said first pattern area, and thus create a first pattern in said first pattern area, but not expose said second pattern area; and b) exposing the photoresist through a second mask so as to expose said second pattern area, and thus create a second pattern in said second pattern area, but not expose said first pattern area, and also to expose an area of said first region which lies adjacent said second region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
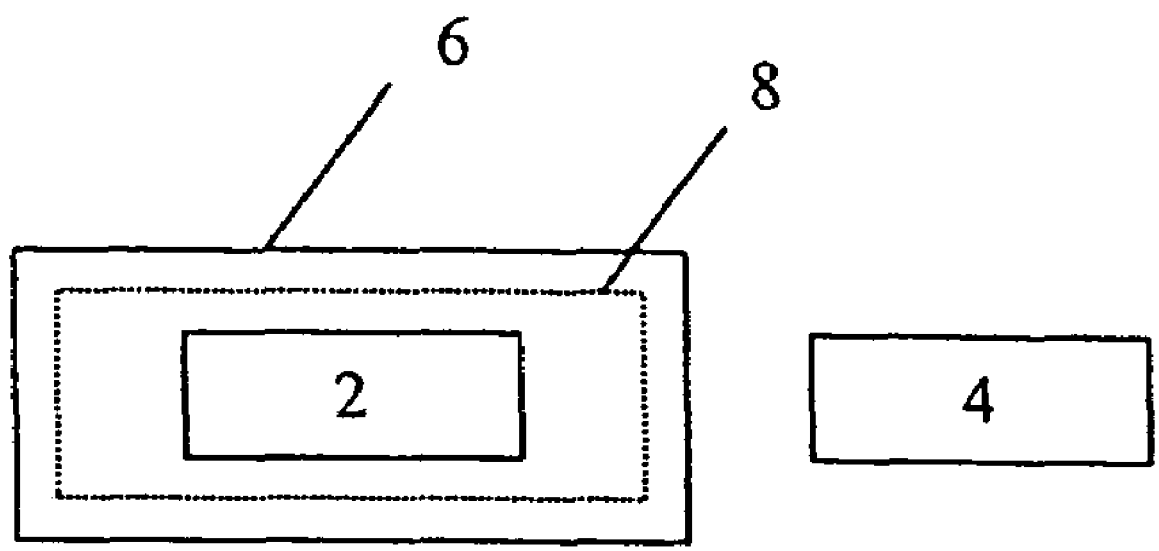
FIG. 1 is a schematic illustration of two patterned areas on a multi-level wafer.

It may be necessary to define patterns on two different levels of circuit topography, in microelectronics or MEMS (micro electrical mechanical systems) circuits, by optical lithography in cases where upper and lower resist images have to be equal in line width and resist profile. The lower resist image may be formed in a recessed area of the wafer.

Some lithography applications in microelectronic or MEMS circuits require patterns, whose line width and resist shapes have to be closely matched to ensure correct circuit operation, to be defined on different circuit levels as defined by underlying processing. The cross-sectional contour of such a part-processed wafer, usually Silicon but the technique described here can be applied to any substrate, is often described as circuit topography.

The difficulty of processing such demanding requirements accurately is that the defining optical system, usually a monochromatic reduction lens at 436 or 365 nm wavelength, has a depth-of-focus (DOF) of about 2 micron in which line width and profile of the developed resist image can be controlled. Therefore when circuit topography is of the same order as the DOF or greater, resist patterns cannot be adequately controlled resulting in inaccurate line widths in the etched patterns. Indeed, both line width and shape of the resist image contribute towards the etched line width. Additionally, the resist may be coated thicker over the lower patterns, which can be placed in a recess, thus leading to difficulties in completely clearing the developed resist within the patterned area and at the edges of the recess. Typical line width in the applications tested was between 1 and 2 micron.

Preliminary tests are briefly described here in order to illustrate difficulties and thus confirm why simpler techniques are unsuitable. The difference between upper and lower patterning levels here is 2 micron.

i). The first approach was to use a thick resist of the order of 4 micron. In general, the resist planarises over circuit topography so a thick resist is better suited to defining patterns on two circuit levels with a single exposure. Inspection by electron microscopy (SEM) showed that when patterns on the upper level were clearly developed and correctly exposed, the lower patterns exhibited resist scumming. Increasing develop time had no effect on residues.

ii). We also tried using an alternative resist which has better conformality over circuit topography so that the difference between coated resist thickness over each set of patterns is reduced. The characteristics of coating over a step are that the resist will be thicker at the edges of the recess in which the lower patterns are sited. In this case, when upper patterns were exposed to size, the lower patterns in their recess exhibited residues only around the edges of the recess.

iii). The next approach to obtaining clear development in the lower patterns with the same resist was to use a double puddle develop process. Puddle development is known and entails covering a wafer with developer and allowing it to be static for times of about 45 seconds until the developer is depleted. In double puddle development, which can have advantages in thick resist applications, a second charge of developer is applied after spinning off the first. In this test some undeveloped resist was still visible in the lower patterns but the double develop technique was maintained in subsequent tests.

iv). The limitations of the preliminary tests above using a resist of good conformality are that:

a) When the upper patterns are correctly defined the lower patterns exhibit scumming even with double develop.

b) The patterns are defined with a single mask and single exposure, so that line widths cannot be matched.

According to the invention there is provided a method of performing photolithography and a pair of masks for use in such a method, as set out in the accompanying claims.

It will be appreciated that the method results in the edge of any recessed area receiving a double exposure, thus ensuring that the resist is properly cleared in this area.

An embodiment of the invention will now be described, by way of example only, with reference to the accompanying FIG. 1, which is a schematic illustration of two patterned areas on a multi-level wafer.

Figure 4:
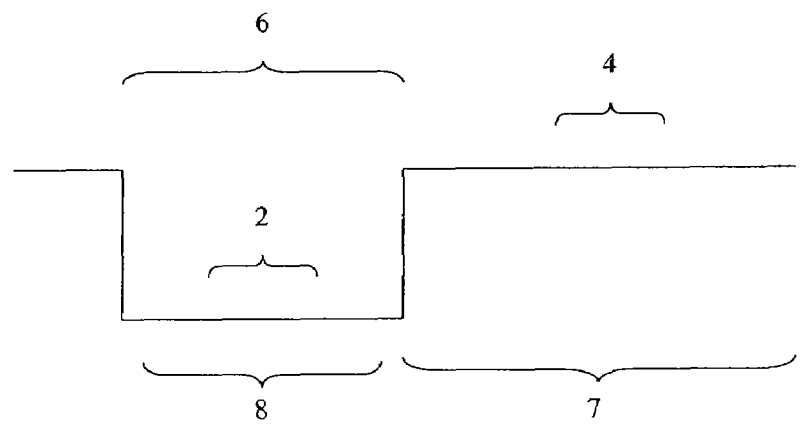
FIG. 4 is a schematic illustration of a first region and a second region.

Referring to FIGS. 1 and 4, a wafer substrate is provided with two pattern areas 2 and 4. Pattern area 2 lies within a recess 6, and is thus at a lower level than pattern area 4. As shown in FIG. 4, a second region 7 is located on the upper level.

The substrate is coated with a photoresist, which tends to be thicker at the edges of the recessed area 6, at the bottom of the step between the upper and lower levels.

Figure 2:
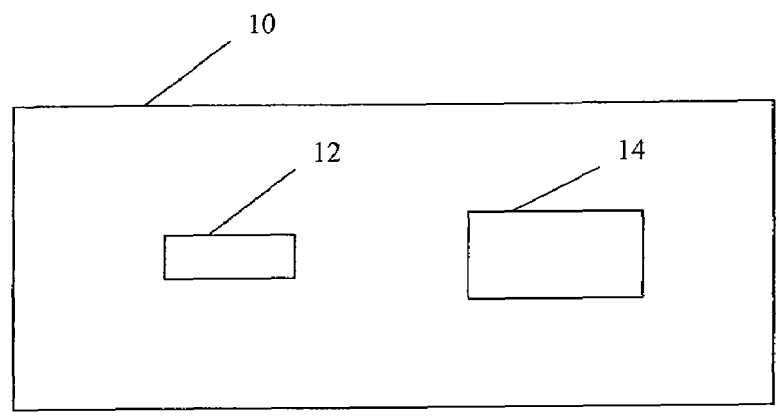
FIG. 2 is a schematic illustration of a first mask.
Figure 3:
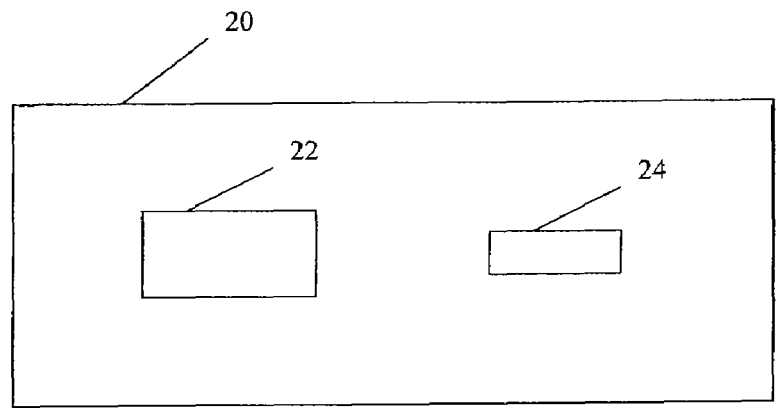
FIG. 3 is a schematic illustration of a first mask.

The photoresist is exposed in two stages. In the first stage, a pattern is created on pattern area 2 (by exposing pattern area 2 through a reticle), while pattern area 4 is masked. This is done using a first mask 10 as illustrated in FIG. 2, wherein the first mask 10 includes a first patterned area 12 and an opague region/(chrome) patch 14. In the second stage, a pattern is created on pattern area 4 (by exposing pattern area 4 through a reticle), while pattern area 2 is masked. This is done using a second mask 20 as illustrated in FIG. 3, wherein the second mask 20 includes a second patterned area 24 and an opague region/(chrome) patch 22.

The second mask is provided with a "patch" which masks pattern area 2. However, although the patch covers pattern area 2, it does not cover the whole of recessed area 6. Dotted line 8 illustrates schematically the area covered by the patch. In fact, the patch only extends about 5 microns beyond the edges of the pattern area 2. The result is that the edge of the recessed area 6, which lies outside of the patched area 8, receives a double exposure, which ensures that the resist is properly cleared in this area.

It should be appreciated that there may be any number of upper and lower pattern areas on the substrate, but only two are shown in the accompanying FIG. 1 for clarity.

It will thus be seen that the technique described here uses two masks to define the upper and lower layers in separate exposure operations. In this embodiment (which is suitable for manufacturing an infra red detector) there is a need to create identical patterns on upper and lower levels. The masks for this embodiment are identical in all but two important respects. The mask used to define the upper patterns has protective chrome patches over all the lower patterned areas and, likewise, the mask used to define the lower patterns has similar chrome patches over all the upper patterned areas. The size of the chrome patches extends beyond the edges of the patterns which they protect by only 5 micron (at the wafer scale) on each side.

Therefore, when the masks are applied sequentially, upper and lower patterns receive a single exposure but the recess surrounding the lower patterns receives a double exposure thus ensuring complete resist clearance during double development. Other non-patterned circuit areas will harmlessly also receive a double exposure. The exposures and focus settings used for each mask can be different thus ensuring correct linewidths and profiles in the developed resist images.

In this embodiment, wafers were coated with 1.8 micron of the chosen resist and exposed at 365 nm wavelength with the mask pair in turn. No importance is attached to whether upper or lower patterns are defined first. The upper patterns were exposed at 250 mJ and zero focus whereas the lower were exposed at 230 mJ and with a 2.0 micron focus offset. Wafers were then developed using the double puddle process.

This embodiment allows patterns to be defined on different circuit topography where line widths have to be matched. The pair of masks allow separate exposure and focus conditions and double exposure of the troublesome recess around the lower patterned area where the resist tends to be thicker as it covers topography. Different types of resist can be used, and the double develop process is optional.

In one embodiment, a positioning means is used for positioning the first mask such that the first patterned area is positioned for exposing said first pattern area and such that the first opaque region is positioned so as to cover at least the second pattern area at the same time, the positioning means further being arranged so as to position the second mask such that the second patterned area is positioned for exposing the second pattern area and such that the second opaque region is positioned so as to cover at least the first pattern area at the same time In another embodiment, lithography for bolometer BM layer has been developed and will use a double puddle/ double develop process using two separate reticles, BT and BR, so as to achieve clear development of the lower bolometer, matched CD's and acceptable resist profiles. Linewidth distributions across upper and lower bolometers have been calibrated and show that uniform CD's across the lower bolometer can be achieved provided that the recess is correctly sized. Likewise, for the upper bolometer, uniform CD's can be achieved on dense bolometer arrays when they are protected by a dummy ring thus facilitating distribution across the outer bolometer.

In another embodiment, each mask may optionally include a barcode label.

While the foregoing is directed to embodiments of the present invention, other and further embodiments of the invention may be devised without departing from the basic scope thereof, and the scope thereof is determined by the claims that follow.

The invention claimed is:

1. A pair of masks for use in performing photolithography on a substrate which has a first region on a lower level and a second region on an upper level, wherein a first pattern area exists within said first region, a second pattern area exists within said second region, and at least said first and second regions are coated with a photoresist, comprising:
   a first mask of said pair of masks, said first mask containing a patterned area for exposing said first pattern area, and an opaque region arranged to cover at least said second pattern area at a same time; and
   a second mask of said pair of masks, said second mask containing a second patterned area for exposing said second pattern area, and an opaque region arranged to cover at least said first pattern area at a same time.

2. The pair of masks as claimed in claim 1, wherein the second mask is arranged to permit exposure of an area of said first region which lies adjacent said second region.

3. The pair of masks as claimed in claim 1, wherein said first region is a recessed region which lies within said second region.

4. The pair of masks as claimed in claim 3, wherein the second mask is arranged to permit exposure of an area of said first region which lies adjacent said second region.

5. The pair of masks as claimed in claim 4, wherein said area of said first region which the second mask is arranged to permit to be exposed is a boundary area which lies around the edges of said first region.

6. The pair of masks as claimed in claim 5, wherein said boundary area extends along the entire edge of said first region, and the second mask is arranged to permit exposure of the entire boundary area.

7. The pair of masks as claimed in claim 1, wherein said first and second masks are equal, except that they are provided with patches in different positions.

8. A system for performing photolithography, comprising:
a pair of masks for masking a substrate which has a first region on a lower level and a second region on an upper level, wherein a first pattern area exists within said first region, a second pattern area exists within said second region, and at least said first and second regions are coated with a photoresist, wherein:
a first mask of said pair of masks contains a patterned area for exposing said first pattern area, and a first opaque region arranged to cover at least said second pattern area at the same time; and
a second mask of said pair of masks contains a second patterned area for exposing said second pattern area, and a second opaque region arranged to cover at least said first pattern area at the same time.

9. The system as claimed in claim 8, further including a positioning apparatus for positioning the first mask such that the first patterned area is positioned for exposing said first pattern area and such that the first opaque region is positioned so as to cover at least the second pattern area at the same time, the positioning apparatus further being arranged so as to position the second mask such that the second patterned area is positioned for exposing the second pattern area and such that the second opaque region is positioned so as to cover at least the first pattern area at the same time.

10. The system as claimed in claim 8, further including a positioning means for positioning the first mask such that the first patterned area is positioned for exposing said first pattern area and such that the first opaque region is positioned so as to cover at least the second pattern area at the same time, the positioning means further being arranged so as to position the second mask such that the second patterned area is positioned for exposing the second pattern area and such that the second opaque region is positioned so as to cover at least the first pattern area at the same time.

* * * * *